(12) United States Patent
Chin et al.

(10) Patent No.: US 7,375,464 B2
(45) Date of Patent: May 20, 2008

(54) FULL-COLOR ORGANIC LIGHT EMITTING DISPLAY HAVING RED, GREEN, BLUE, CYAN, MAGENTA, AND YELLOW COLOR MODULATION LAYERS

(75) Inventors: Byung-Doo Chin, Suwon-si (KR); Min-Chul Suh, Suwon-si (KR); Mu-Hyun Kim, Suwon-si (KR); Hye-Dong Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 21 days.

(21) Appl. No.: 11/251,866

(22) Filed: Oct. 18, 2005

(65) Prior Publication Data
US 2006/0082295 A1 Apr. 20, 2006

(30) Foreign Application Priority Data
Oct. 18, 2004 (KR) ...................... 10-2004-0083317

(51) Int. Cl.
*H05B 33/00* (2006.01)
(52) U.S. Cl. ...................... 313/506; 313/504; 313/112; 313/113; 315/169.3; 345/45; 345/76; 348/835
(58) Field of Classification Search ................ 313/110, 313/111, 112, 113, 114, 501, 503, 504, 505, 313/506
See application file for complete search history.

(56) References Cited

U.S. PATENT DOCUMENTS 5,661,371 A * 8/1997 Salerno et al. ............ 315/169.3
5,739,946 A * 4/1998 Iwanaga et al. ............ 359/296
6,218,679 B1 * 4/2001 Takahara et al. ............... 257/59
6,515,428 B1 2/2003 Yeh et al.
6,570,584 B1 * 5/2003 Cok et al. .................... 345/690
6,628,355 B1 * 9/2003 Takahara .................... 349/106
7,173,373 B2 * 2/2007 Yamada et al. ............. 313/505
2001/0043043 A1 * 11/2001 Aoyama et al. ............ 313/506
2003/0170491 A1 * 9/2003 Liao et al. ................... 428/690
2004/0012330 A1 * 1/2004 Ohshita et al. ............. 313/504
2004/0130253 A1 * 7/2004 Ohsaki et al. .............. 313/110
2006/0007077 A1 * 1/2006 Joo et al. ...................... 345/77

FOREIGN PATENT DOCUMENTS

KR   1020040010232   1/2004

\* cited by examiner

*Primary Examiner*—Ashok Patel
(74) *Attorney, Agent, or Firm*—Robert E. Bushnell, Esq.

(57) ABSTRACT

An organic light emitting display having red, green, blue, cyan, magenta, and yellow color modulation layers. The organic light emitting display includes a substrate, a first electrode arranged on the substrate, a second electrode arranged on the first electrode, an organic functional layer arranged between the first electrode and the second electrode, the organic functional layer comprises at least an emission layer, and red, green, blue, cyan, magenta, and yellow color modulation layers separated from each other, wherein one of the first electrode and the second electrode is transparent and is arranged between each color modulation layer and the emission layer. Accordingly, it is possible to maintain white balance even for an aged display while having enhanced color reproducibility.

26 Claims, 9 Drawing Sheets

FULL-COLOR ORGANIC LIGHT EMITTING DISPLAY HAVING RED, GREEN, BLUE, CYAN, MAGENTA, AND YELLOW COLOR MODULATION LAYERS

CLAIM OF PRIORITY

This application makes reference to, incorporates the same herein, and claims all benefits accruing under 35 U.S.C. §119 from an application for FULL COLOR OLED HAVING RED, GREEN, BLUE, CYAN, MAGENTA AND YELLOW COLOR MODULATION LAYERS earlier filed in the Korean Intellectual Property Office on 18 Oct. 2004 and there duly assigned Serial No. 10-2004-0083317.

BACKGROUND OF THE INVENTION

1. Field of the Invention

The present invention relates to an organic light emitting display (OLED), and more particularly to an organic light emitting display having color modulation layers.

2. Description of the Related Art

In general, an organic light emitting display includes a substrate, an anode located on the substrate, an emission layer (EML) located on the anode, and a cathode located on the emission layer. In such an organic light emitting display, when a voltage is applied between the anode and the cathode, holes and electrons are injected into the emission layer, the holes and the electrons injected into the emission layer are recombined to emit light.

A method of forming emission layers corresponding to red, green, and blue is used to realize a full color of the organic light emitting display. However, since the emission layers corresponding to red, green, and blue have different lifetime characteristics, it is difficult to maintain white balance when the display ages.

In order to solve the above-mentioned problem, there has been known a method of forming an emission layer emitting white light and forming color filter layers extracting light components corresponding to red, green, and blue from the white light emitted from the emission layer. For example, U.S. Pat. No. 6,515,428 to Yeh et al discloses an active matrix organic light emitting display having an emission layer for emitting white light and red, green, and blue color filters which are formed using a photolithography method. However, the color reproducibility of such an organic light emitting display depends upon intensity by wavelength of the white light emitted from the emission layer and characteristics of the color filter layers. It is known that the strength or intensity of a green component of the white light emitted from the emission layer is generally small. Thus reproducibility of the organic light emitting display employing the red, green, and blue color filters is poor.

In order to form the color filter layers using the photolithography method, a process of forming color filter layers of respective colors on the whole substrate and exposing, developing, and patterning the color filter layers needs to be repeated. A heating process needs to be performed to remove a volatile solvent contained in the layers formed using the photolithography method. In this method, there are disadvantages in that many process steps are required for forming the color filter layers using the photolithography method and that the time for fabricating an organic light emitting display is increased. Therefore, what is needed is an improved OLED that can maintain white balance even when aged and can offer improved color reproducibility, reduced fabrication time, and high resolution.

SUMMARY OF THE INVENTION

It is therefore an object of the present invention to provide an improved OLED.

It is also an object of the present invention to provide a design for an OLED that can maintain white balance even when aged and can offer improved color reproducibility, reduced fabrication time, and high resolution.

These and other objects can be achieved by an organic light emitting display that includes a substrate, a first electrode arranged on the substrate, a second electrode arranged on the first electrode, an organic functional layer arranged between the first electrode and the second electrode, the organic functional layer comprises at least an emission layer, and red, green, blue, cyan, magenta, and yellow color modulation layers separated from each other, wherein one of the first electrode and the second electrode is transparent and is arranged between each color modulation layer and the emission layer.

It present invention contemplates at least six designs of an OLED, the six designs being 1) passive matrix top emission OLED, 2) active matrix top emission OLED, 3) passive matrix bottom emission OLED, 4) active matrix bottom emission OLED, 5) passive matrix dual emission OLED and 6) active matrix dual emission OLED. Many more variations of these six types of OLEDs are also discussed. The active matrix OLEDs employ thin film transistors. Each of these six OLEDs employ color modulation layers for each of red, green, blue, yellow, magenta and cyan. The color modulation layers can be simply color filter layers or color conversion layers stacked in top of color filter layers. The emission layer is designed to emit white light. When passing through the color filter layers, one of red, green, blue, yellow, magenta and cyan is produced. When passing through the color conversion layers, the reproducibility of each of these colors is enhanced.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
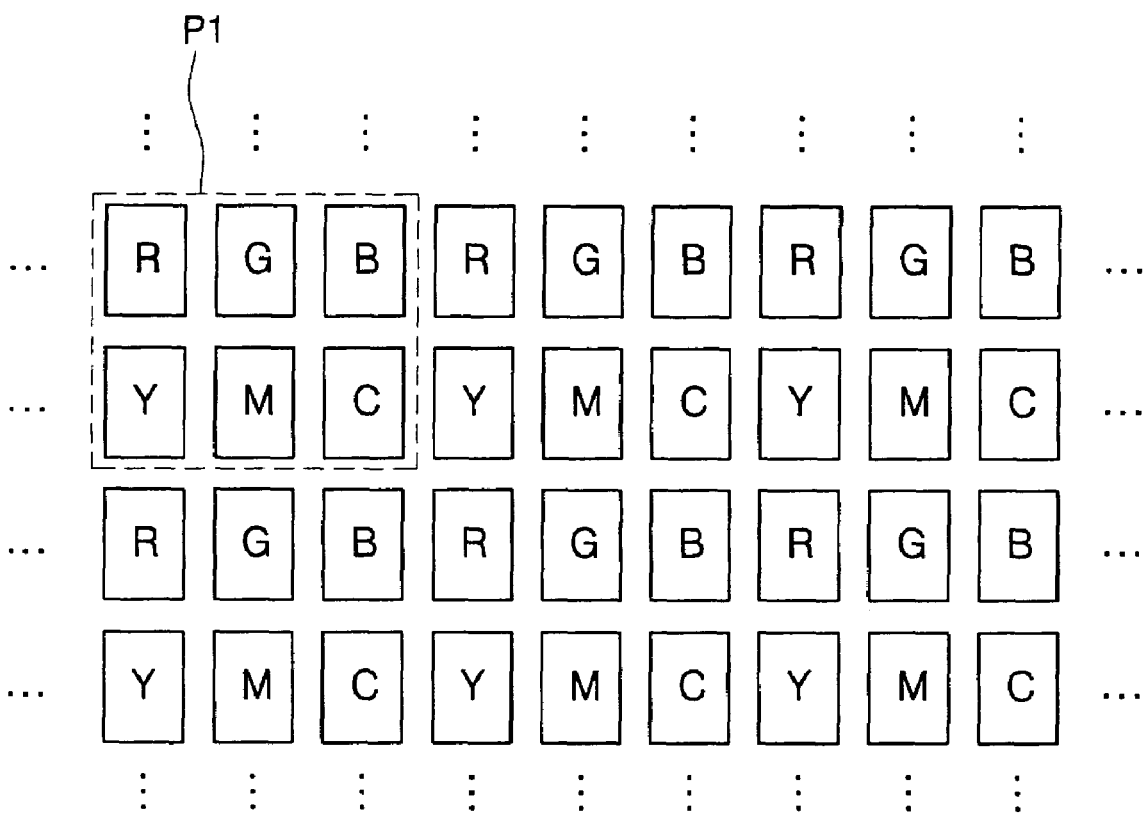
FIGS. 1 and 2 are plan views illustrating unit pixel arrangements of organic light emitting displays according to embodiments of the present invention.
Figure 2:
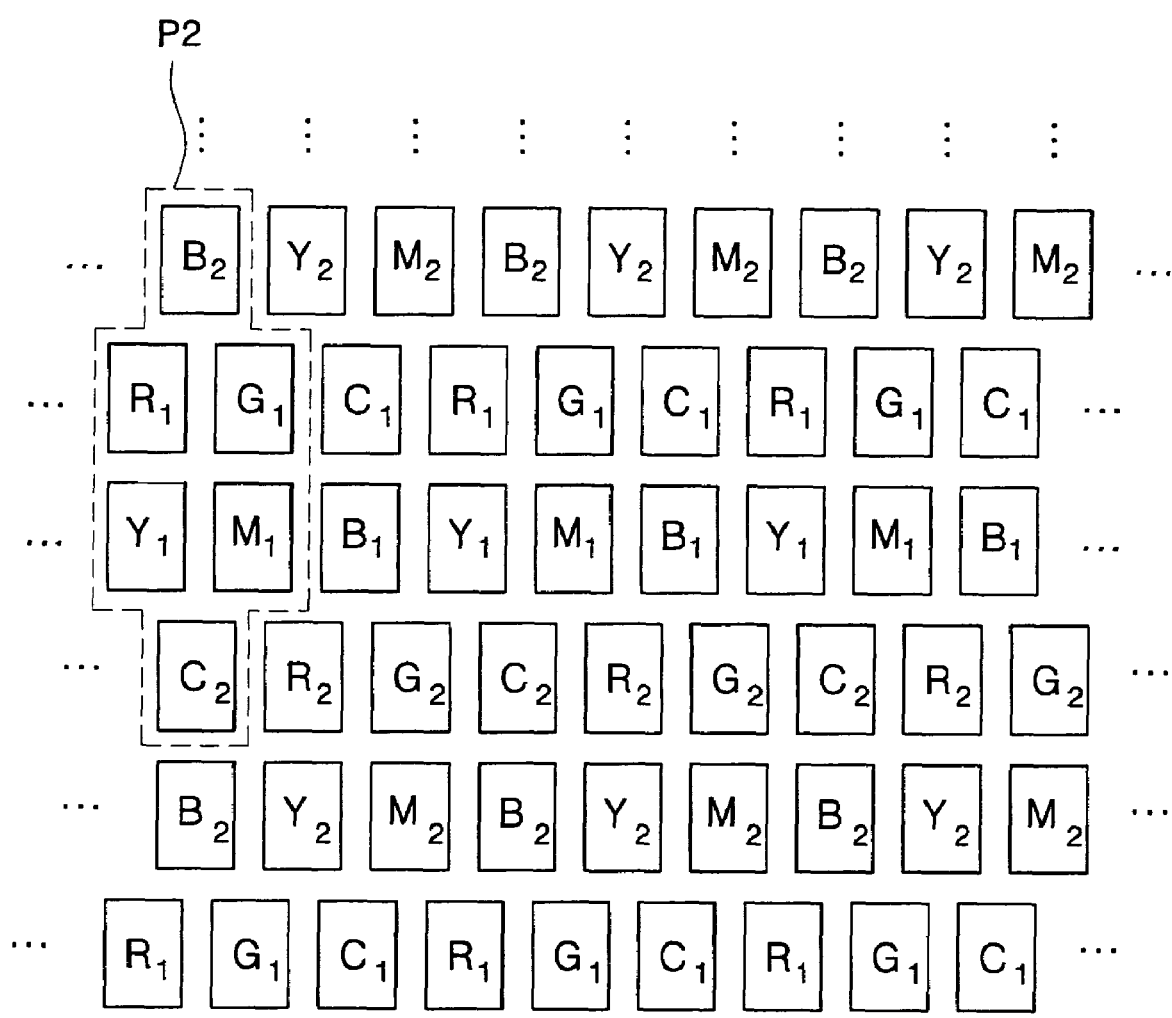

Turning now to the figures, FIGS. 1 and 2 are plan views illustrating pixel arrangements of organic light emitting displays according to embodiments of the present invention. Here, FIG. 1 shows a stripe-type pixel arrangement and FIG. 2 shows a delta-type pixel arrangement.

Referring to FIG. 1, red, green, and blue pixels R, G, and B are repeatedly arranged in a row, and yellow, magenta, and cyan pixels Y, M, and C are repeatedly arranged in another row. The red pixel R and the yellow pixel Y, the green pixel G and the magenta pixel M, and the blue pixel B and the cyan pixel C are located in the same column, respectively, and are repeatedly arranged. The red, green, and blue pixels R, G, and B adjacent to each other and the yellow, magenta, and cyan pixels Y, M, and C adjacent to the red, green, and blue pixels R, G, and B, respectively and all together form a unit pixel P1 as illustrated by the dotted rectangle in FIG. 1.

Turning now to FIG. 2, a first red pixel $R_1$, a first green pixel $G_1$, and a first cyan pixel $C_1$ are repeatedly arranged in a row, and a first yellow pixel $Y_1$, a first magenta pixel $M_1$, and a first blue pixel $B_1$ are repeatedly arranged in another row, which form a first group. In addition, a second red pixel $R_2$, a second green pixel $G_2$, and a second cyan pixel $C_2$ are repeatedly arranged in another row, and a second yellow pixel $Y_2$, a second magenta pixel $M_2$, and a second blue pixel $B_2$ are repeatedly arranged in still another row, which form a second group. The second group is shifted in the horizontal direction by 1.5 pitches from the first group. Therefore, the first red pixel $R_1$, the first green pixel $G_1$, and the second blue pixel $B_2$ form a triangle, and the first yellow pixel $Y_1$, the first magenta pixel $M_1$, and the second cyan pixel $C_2$ form another triangle. The first red pixel $R_1$, the first green pixel $G_1$, the second blue pixel $B_2$, the first yellow pixel $Y_1$, the first magenta pixel $M_1$, and the second cyan pixel $C_2$ constitute a unit pixel P2 as illustrated by the closed dotted line in FIG. 2. Here, the "first pixel" and the "second pixel", for example, the first red pixel $R_1$ and the second red pixel $R_2$, are equal to each other, except that their relative locations in the pixel arrangement are different.

Figure 3:
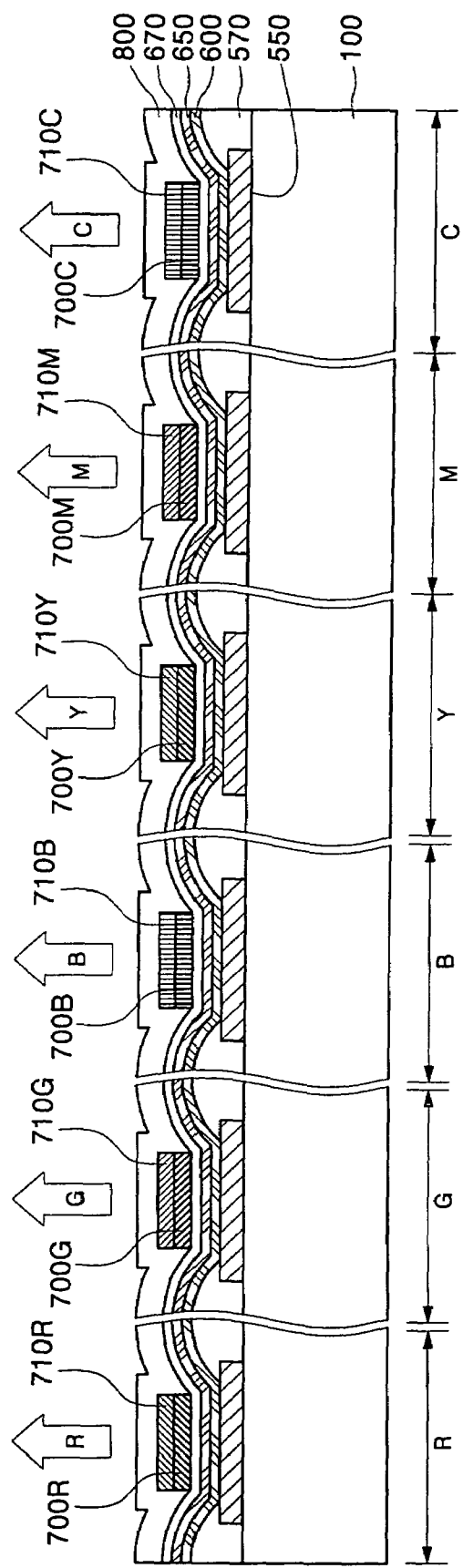
FIG. 3 is a cross-sectional view of a passive matrix top emission OLED according to a first embodiment of the present invention.

Turning now to FIG. 3, FIG. 3 is a cross-sectional view illustrating an organic light emitting display and a fabrication method thereof according to a first embodiment of the present invention. The organic light emitting display of FIG. 3 is a top emission passive matrix type OLED having color modulation layers.

Referring to FIG. 3, a substrate 100 having red, green, blue, yellow, magenta, and cyan pixel areas (R, G, B, Y, M and C) is provided. The substrate 100 can be made of glass, plastic, or quartz. A reflective layer (not shown) can be formed on all the pixel areas of the substrate 100. The reflective layer prevents light from entering the substrate 100.

First electrodes 550 separated from each other in each of R, G, B, Y, M, and C unit pixel areas are formed on the reflective layer. In the present embodiment, the first electrodes 550 are formed as reflective electrodes that reflect light. The first electrodes 550 can be formed as anodes or cathodes. When the first electrodes 550 are anodes, the first electrodes 550 can have a structure obtained by sequentially stacking a reflective plate and an ITO (Indium Tin Oxide) layer or a structure obtained by sequentially stacking a reflective plate and an IZO (Indium Zinc Oxide) layer. The first electrodes 550 can instead have a mono-layered structure made of one of nickel (Ni), platinum (Pt), gold (Au), iridium (Ir), chrome (Cr) or an oxide thereof. The reflective plate can be an aluminum-neodymium (AlNd) layer. On the other hand, when the first electrodes 550 are cathodes, the first electrodes 550 are formed using one of magnesium (Mg), calcium (Ca), aluminum (Al), silver (Ag), barium (Ba), and alloys thereof to have a thickness that is thick enough to reflect light.

A pixel defining layer 570, having openings that expose a portion of the surface of each first electrodes 550, is formed on the substrate 100 on which the first electrodes 550 are formed. The pixel defining layer 570 can be, for example, an acrylic organic layer. Subsequently, an organic functional layer 600 having at least an emission layer is formed on all the R, G, B, Y, M, and C pixel areas including on the exposed portions of first electrodes 550. The organic functional layer 600 can further include a charge transport layer and/or a charge injection layer located on or under the emission layer.

The emission layer can an emission layer that emits white light. When a white light emission layer is employed, the emission layer can have two or more sub emission layers emitting light components having colors. More specifically, one of the sub emission layers can be a sub emission layer emitting orange-red light and the other can be a sub emission layer emitting blue light. Accordingly, white light can be emitted using these two sub emission layers. It is desirable that the sub emission layer that emits orange-red light be phosphorescent and the sub emission layer that emits blue light be fluorescent. A phosphorescent sub emission layer that emits the light of an orange-red range has a higher emission efficiency than that of the fluorescent sub emission layer that emits orange-red light. Also, a fluorescent sub emission layer that emits blue light has superior lifetime characteristics a phosphorescent sub emission layer that emits blue light. Therefore, the emission layer formed by stacking the phosphorescent sub emission layer that emits orange-red light and the fluorescent sub emission layer that emits blue light has both superior emission efficiency and superior lifetime characteristics. Alternatively, the emission layer can instead be formed out of a high-molecular material and/or a low-molecular material using a spin coating method or a vacuum deposition method.

A second electrode 650 is formed on the organic functional layer 600 to cross the first electrodes 550. In the embodiment of FIG. 3, the second electrode 650 is a transparent electrode and the light emitted from the emission layer is radiated through the second electrode 650. When the first electrodes 550 are anodes, the second electrode 650 is a cathode, and when the first electrodes 550 are cathodes, the second electrode 650 is an anode. When the second electrode 650 is a cathode, the second electrode can be made out of Mg, Ca, Al, Ag, Ba, or an alloy thereof and can be formed to have a thickness that is thin enough to allow light to transmit therethrough. When the second electrode 650 is an anode, it is formed out of either ITO or IZO.

It is desirable that a transparent passivation layer 670 is formed on the second electrode 650. The transparent passivation layer 670 can be made of an inorganic layer, an organic layer, or an organic-inorganic complex layer. Preferably, when the transparent passivation layer 670 is an inorganic layer, it is made of either ITO, IZO, $SiO_2$, $SiN_x$, $Y_2O_3$ or $Al_2O_3$. When the transparent passivation layer 670 is an organic layer, it is made out of either parylene or HDPE. When the transparent passivation layer 670 is an organic-inorganic complex layer, it is a compound layer made out of $Al_2O_3$ and an organic polymer.

On top of the transparent passivation layer 670 is a red color modulation layer, a green color modulation layer, a blue color modulation layer, a yellow color modulation layer, a magenta color modulation layer, and a cyan color modulation layer for the R, G, B, Y, M and C pixels, respectively. These modulation layers are formed at locations that correspond to respective first electrodes 550.

The color modulation layers can be color filter layers 710R, 710G, 710B, 710Y, 710M, and 710C. The color filter layers can include a pigment and a polymer binder, and can be classified in red, green, blue, yellow, magenta, and cyan color filter layers, depending upon kinds of the pigment. The color filter layers can filter the white light emitted from the emission layer allowing only the respective colors to pass through. For example, the red color filter layer 710R transmits the red component of the white light emitted from the emission layer while filtering out all the other colors.

It is preferable that the color filter layers 710R, 710G, 710B, 710Y, 710M, and 710C are formed using a laser thermal transfer imaging (LITI) method. The formation of the color filter layers using the LITI method will now described in detail. First, red, green, blue, yellow, magenta, and cyan donor films for forming the color filter layers are prepared. The preparation of the donor films are performed by forming a light-to-heat conversion layer on a base film and then forming a transfer layer for a color filter layer corresponding to each color on the light-to-heat conversion layer. Subsequently, one of the donor films, for example, the red donor film is positioned on the substrate 100 having the transparent passivation layer 670, such that the transfer layer for a color filter layer faces the substrate 100. Then, laser beams are irradiated onto the base film, thus transferring the transfer layer for the red color filter layer 710R onto the transparent passivation layer 670. As a result, the red color filter layer 710R corresponding to a corresponding first electrode 550 is formed on the transparent passivation layer 670 in the red pixel area R. By repeating this process, the green color filter layer 710G, the blue color filter layer 710B, the yellow color filter layer 710Y, the magenta color filter layer 710M, and the cyan color filter layer 710C are formed on the transparent passivation layer 670 in their G, B, Y, M and C pixel regions respectively. Accordingly, the fabrication time can be reduced compared with when the color filter layers are formed using a photolithography method in which exposure and development are repeatedly performed. Also, the resolution can be enhanced compared with when the color filter layers are formed using a vacuum deposition method.

Unlike the above-mentioned scenario where the color modulation layers are color filter layers, the color modulation layers can instead have a stacked structure of the color filter layers 710R, 710G, 710B, 710Y, 710M, and 710C and color conversion layers 700R, 700G, 700B, 700Y, 700M, and 700C positioned under the color filter layers 710R, 710G, 710B, 710Y, 710M, and 710C, respectively. In this case, before forming the color filter layers 710R, 710G, 710B, 710Y, 710M, and 710C, the red color conversion layer 700R, the green color conversion layer 700G, the blue color conversion layer 700B, the yellow color conversion layer 700Y, the magenta color conversion layer 700M, and the cyan color conversion layer 700C are formed on the transparent passivation layer 670 using the LITI method to correspond to the respective first electrodes 550. Accordingly, it is possible to form color modulation layer patterns in which the color conversion layers 700R, 700G, 700B, 700Y, 700M, and 700C and the color filter layers 710R, 710G, 710B, 710Y, 710M, and 710C are sequentially stacked. It is preferable that the respective color modulation layer patterns are formed at once using the LITI method.

The color conversion layer can include a fluorescent material and a polymer binder. The fluorescent material emits light having a wavelength greater than that of light entered from the emission layer and the fluorescent material is excited by the entered light as electrons return to a ground state. At this time, the color conversion layers can be classified into red, green, blue, yellow, magenta, and cyan color conversion layers, depending upon kinds of the fluorescent material.

Therefore, when each color modulation layer has the stacked structure of the color conversion layer and the color filter layer, the white light emitted from the emission layer is converted to a red light beam upon passing through the red color conversion layer 700R, and the converted red light beam is filtered into a red light beam having high purity upon passing through the red color filter layer 710R. Therefore, when the color modulation layer has the stacked structure of the color conversion layer and the color filter layer, it is possible to obtain colors having high color purity.

Subsequently, it is preferable that an over-coating layer 800 is formed on the color modulation layers. The over-coating layer 800 is a transparent layer that protects the color modulation layers from physical damage.

In the embodiment of FIG. 3, the light emitted from the emission layer is radiated through a transparent electrode, i.e. the second electrode 650, and through the color modulation layers, the color modulation layers being located on an opposite side of the second electrode 650 than the emission layer. As a result, it is possible to produce red, green, blue, yellow, magenta, and cyan colors having high color purity, resulting in a top-emission organic light emitting display having enhanced color reproducibility.

Figure 4:
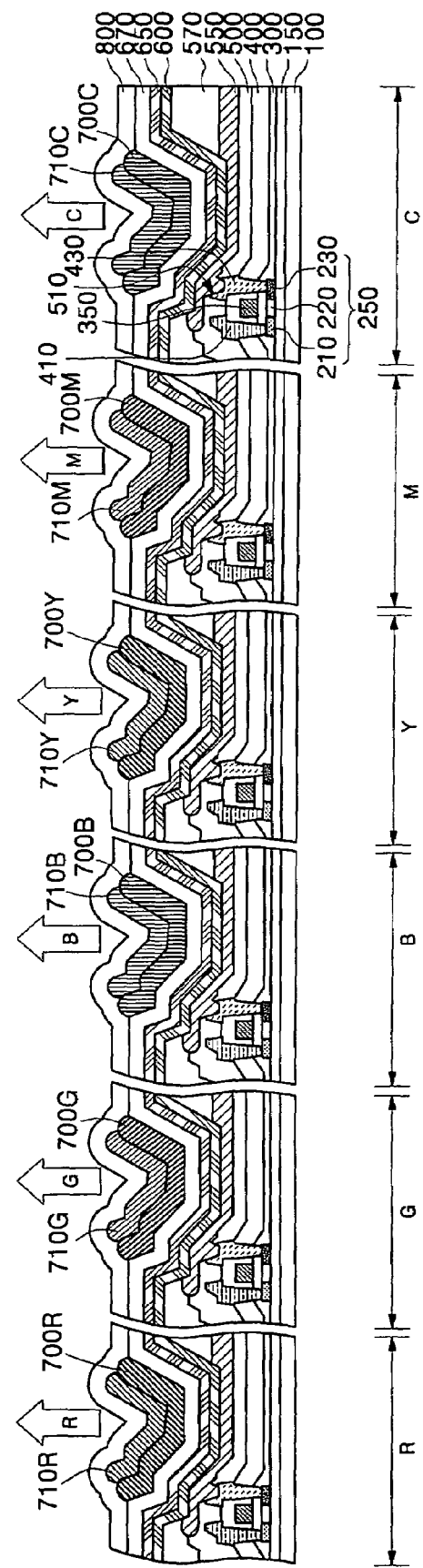
FIG. 4 is a cross-sectional view of an active matrix top emission OLED according to a second embodiment of the present invention.

Turning now to FIG. 4, FIG. 4 is a cross-sectional view illustrating an organic light emitting display and a fabrication method thereof according to a second embodiment of the present invention. The organic light emitting display of FIG. 4 is of a top-emission active matrix type OLED having color modulation layers.

Referring to FIG. 4, a buffer layer 150 is formed on the substrate 100 having red, green, blue, yellow, magenta, and cyan pixel areas (R, G, B, Y, M, and C). The buffer layer 150 protects thin film transistors that are later formed in a subsequent process from impurities migrating from the substrate 100. An active layer 250 having a source region 210, a drain region 230, and a channel region 220 is formed on the buffer layer 150 of the respective R, G, B, Y, M, and C pixel areas. A gate insulating layer 300 is formed on the active layer 250. A gate electrode 350 is formed on the gate insulating layer 300 and overlaps the channel region 220. Subsequently, a first insulating interlayer 400 is formed to cover the gate electrodes 350. Source electrode 410 and drain electrode 430 are formed on the first insulating interlayer 400 and are electrically connected to the source region 210 and the drain region 230, respectively. The active layer 250, the source electrode 410, the drain electrode 430, and the gate electrode 350 make up a thin film transistor. Thin film transistors are located on the respective R, G, B, Y, M, and C pixel areas. Subsequently, a second insulating interlayer 500 is formed to cover the thin film transistors, and a via hole 510 that exposes the drain electrode 430 is formed in the second insulating interlayer 500. The second insulating interlayer 500 can be a layer of inorganic material, an layer of organic material, or a composite of organic and inorganic materials. The inorganic material is preferably silicon nitride which can passivate the underlying active layer 250 with hydrogen as well as prevent infiltration of moisture and oxygen. The organic material is preferably BCB (BenzoCycloButene) or acrylic organic material which can cover step differences caused by the underlying patterns.

First electrodes 550 are separated from each other in a unit of pixel areas R, G, B, Y, M, and C and are formed on the substrate 100 in which the via holes 510 are formed. As a result, the first electrodes 550 are electrically connected to the drain electrodes 430 of each of the thin film transistors, via via holes 510, respectively.

A pixel defining layer 570, an organic functional layer 600 having at least an emission layer, a second electrode 650, a transparent passivation layer 670, color modulation layers, and an over-coating layer 800 are formed on the first electrodes 550. The color modulation layers can have a mono-layered structure of a color filter layer, or can have a stacked structure in which a color conversion layer and a color filter layer are sequentially stacked. Since the first electrodes 550, the pixel defining layer 570, the organic functional layer 600, the second electrode 650, the transparent passivation layer 670, the color modulation layers, and the over-coating layer 800 have already been described in conjunction with FIG. 3, the descriptions thereof will be omitted.

Figure 5:
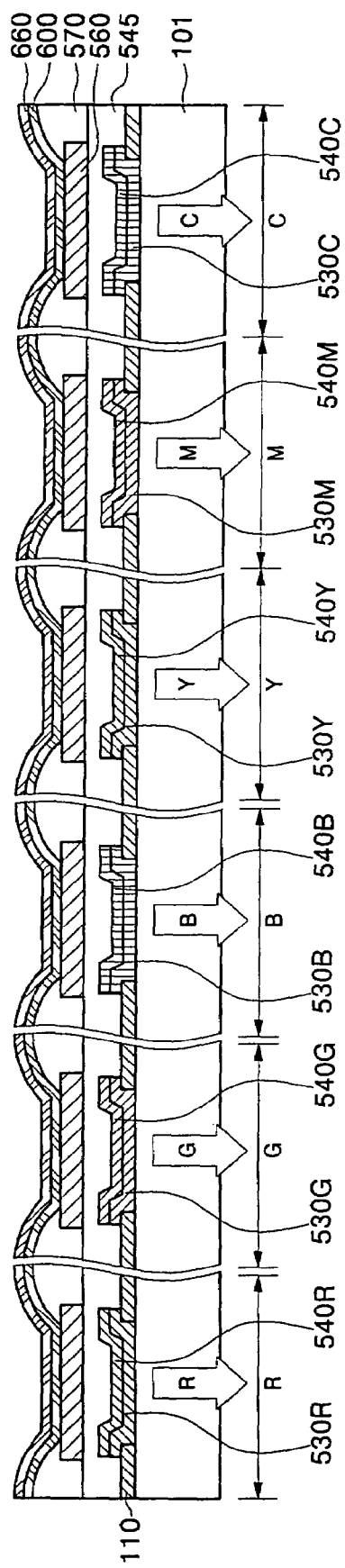
FIG. 5 is a cross-sectional view of a passive matrix bottom emission OLED according to a third embodiment of the present invention.

Turning now to FIG. 5, FIG. 5 is a cross-sectional view illustrating an organic light emitting display and a fabrication method thereof according to a third embodiment of the present invention. The organic light emitting display of FIG. 5 is of a bottom-emission passive matrix type OLED having color modulation layers.

Referring to FIG. 5, a substrate 101 having red, green, blue, yellow, magenta, and cyan pixel areas R, G, B, Y, M, and C is prepared. The substrate 101 is a transparent substrate and can be made of glass, plastic, or quartz. A black matrix pattern 110 can be formed on the substrate 101. The black matrix pattern 110 can be made of a chrome oxide ($CrO_x$) layer, a molybdenum oxide ($MoO_x$) layer, or an MIHL (Metal Insulator Hybrid Layer).

Color modulation layers are separated from each other in unit of pixel areas R, G, B, Y, M, and C and are formed on the substrate 101. The color modulation layers can be color filter layers, that is, a red color filter layer 530R, a green color filter layer 530G, a blue color filter layer 530B, a yellow color filter layer 530Y, a magenta color filter layer 530M, and a cyan color filter layer 530C. Moreover, the color modulation layers can further include a red color conversion layer 540R, a green color conversion layer 540G, a blue color conversion layer 540B, a yellow color conversion layer 540Y, a magenta color conversion layer 540M, and a cyan color conversion layer 540C stacked on the respective color filter layers and formed in the R, G, B, Y, M and C pixel areas respectively. Since the color modulation layers and the method of forming the color modulation layers have been already described in detail in conjunction with FIG. 3, descriptions thereof will be omitted.

Subsequently, it is preferable that an over-coating layer 545 is formed on the substrate 101 on which the color modulation layers are formed. The over-coating layer 545 is a transparent layer and coats step differences generated due to the formation of the color modulation layers as well as protects the color modulation layers from physical damage.

Subsequently, first electrodes 560 are formed on the over-coating layer 545 to correspond to the color modulation layers, respectively. In the embodiment of FIG. 5, the first electrodes 560 are transparent electrodes, and thus the light emitted from an emission layer to be formed in a subsequent process is radiated through the first electrodes 560. The first electrodes 560 can be formed as an anode or a cathode. When the first electrodes 560 are cathodes, the first electrodes 560 are made out of Mg, Ca, Al, Ag, Ba, or alloys thereof to have a small enough thickness to allow light to pass through. When the first electrodes 560 are anodes, the first electrodes 560 are made out of ITO or IZO.

A pixel defining layer 570 and an organic functional layer 600 having at least an emission layer are formed on the substrate 101 on which the first electrodes 560 are formed. Since the pixel defining layer 570 and the organic functional layer 600 have already been described in detail with reference to FIG. 3, descriptions thereof will be omitted.

Subsequently, a second electrode 660 is formed on the organic functional layer 600 to cross the first electrodes 560. In the present embodiment, the second electrode 660 is formed as a reflective electrode that reflects light. The second electrode 660 is formed as a cathode when the first electrode 560 is an anode, and the second electrode 660 is formed as an anode when the first electrode 560 is a cathode. When the second electrode 660 is an anode, the second electrode 660 can have a structure in which an ITO layer and a reflective plate are sequentially stacked. Alternatively, when the second electrode 660 is an anode, the second electrode 660 can have a structure in which an IZO layer and a reflective plate are sequentially stacked. Still alternatively, when the second electrode 660 is an anode, the second electrode 660 can instead be a mono-layered structure made out of one of Ni, Pt, Au, Ir, Cr or an oxide thereof. The reflective plate can be an AlNd layer.

In the embodiment of FIG. 5, the light emitted from the emission layer passes through the first electrodes 560, (i.e. transparent electrodes) and also through the color modulation layers, and then is radiated toward the substrate 101. In the display structure of FIG. 5, the color modulation layers are located on the opposite side of the first electrodes 560 than the emission layers. As a result, it is possible to realize red, green, blue, yellow, magenta, and cyan color light with high color purity, thus obtaining a bottom-emission organic light emitting display having enhanced color reproducibility.

Figure 6:
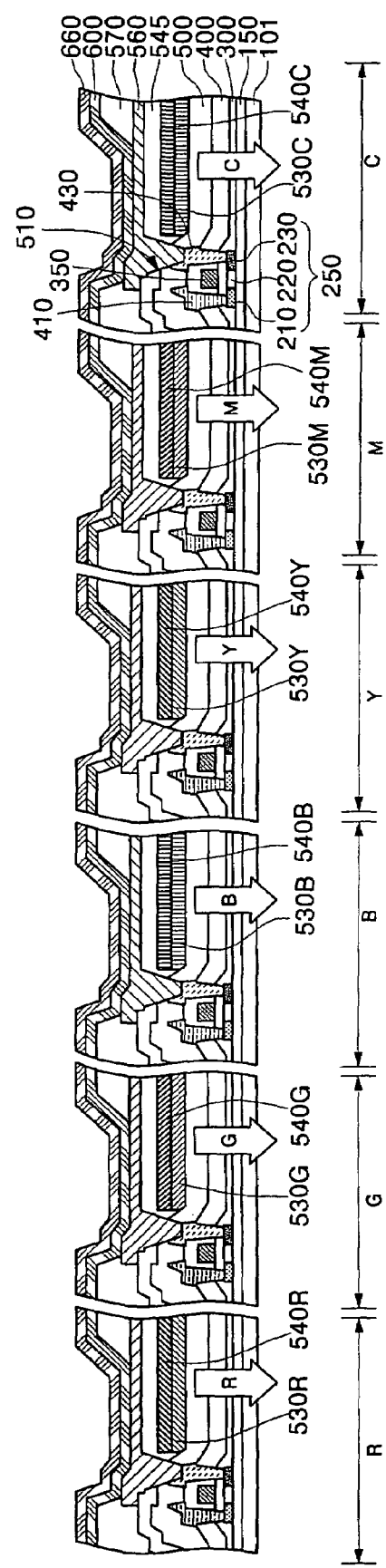
FIG. 6 is a cross-sectional view of an active matrix bottom emission OLED according to a fourth embodiment of the present invention.

Turning now to FIG. 6, FIG. 6 is a cross-sectional view illustrating an organic light emitting display and a fabrication method thereof according to a fourth embodiment of the present invention. The organic light emitting display of FIG. 6 is of a bottom-emission active matrix type OLED display having color modulation layers.

Referring now to FIG. 6, a substrate 101 having red, green, blue, yellow, magenta, and cyan pixel areas (R, G, B, Y, M, and C) is prepared. The substrate 101 is a transparent substrate and can be made of glass, plastic, or quartz. A buffer layer 150 substantially equal to that described in the embodiment of FIG. 4, an active layer 250 having a source region 210, a drain region 230, and a channel region 220, a gate insulating layer 300, a gate electrode 350, a first insulating interlayer 400, a source electrode 410, a drain electrode 430, and a second insulating interlayer 500 are formed on the substrate 101. The active layer 250, the source electrode 410, the drain electrode 430, and the gate electrode 350 make up a thin film transistor. A thin film transistor is positioned in each of the R, G, B, Y, M, and C pixel areas. In the R, G, B, Y, M, and C pixel areas of the substrate 101, the areas in which the thin film transistors are formed are light-shielding areas blocking the light emitted from an emission layer that is later formed in a subsequent process.

Areas outside the light-shielding areas are light-transmitting areas allowing light emitted from an emission layer to transmit therethrough.

After formation of the thin film transistors, color modulation layers separated from each other in R, G, B, Y, M, and C unit of pixel areas and the second insulating interlayer 500 in the light-transmitting areas are formed. The color modulation layers can have a mono-layered structure of color filter layers 530R, 530G, 530B, 530Y, 530M, and 530C, or can have a stacked structure having the color filter layers and a color conversion layers 540R, 540G, 540B, 540Y, 540M, and 540C stacked on the color filter layers. Subsequently, it is preferable that an over-coating layer 545 is formed over the color modulation layers. Since the color modulation layers and the over-coating layer 545 have already been described in detail in conjunction with FIG. 5, descriptions thereof will be omitted.

An alternative design to that of FIG. 6, the color modulation layers can instead be formed between the first insulating interlayer 400 and the second insulating interlayer 500 in the light-transmitting areas. Another alternative design is to have the color modulation layers positioned between the gate insulating layer 300 and the first insulating interlayer 400 in the light-transmitting areas. Still another alternative design is to have the color modulation layers positioned between the buffer layer 150 and the gate insulating layer 300 in the light-transmitting areas. Yet another alternative design is to have the color modulation layers positioned between the substrate 101 and the buffer layer 150 in the light-transmitting areas. With each of these alternative designs, the formation of the over-coating layer 545 can be omitted.

Subsequently, a via hole 510 that exposes the drain electrode 430 is formed in the over-coating layer 545 and in the second insulating interlayer 500. First electrodes 560, which are separated from each other in the R, G, B, Y, M, and C unit of pixel areas and which correspond to the color modulation layers, respectively, are formed on the substrate 101 in which the via holes are formed 510. Accordingly, the first electrodes 560 are electrically connected to the drain electrodes 430 of the thin film transistors through the via holes 510.

Subsequently, a pixel defining layer 570, an organic functional layer 600 having at least an emission layer, and a second electrode 660 are formed on the first electrodes 560. Since the first electrodes 560, the pixel defining layer 570, the organic functional layer 600 having at least an emission layer, and the second electrode 660 have already been described in detail in conjunction with FIG. 5, descriptions thereof will be omitted.

Figure 7:
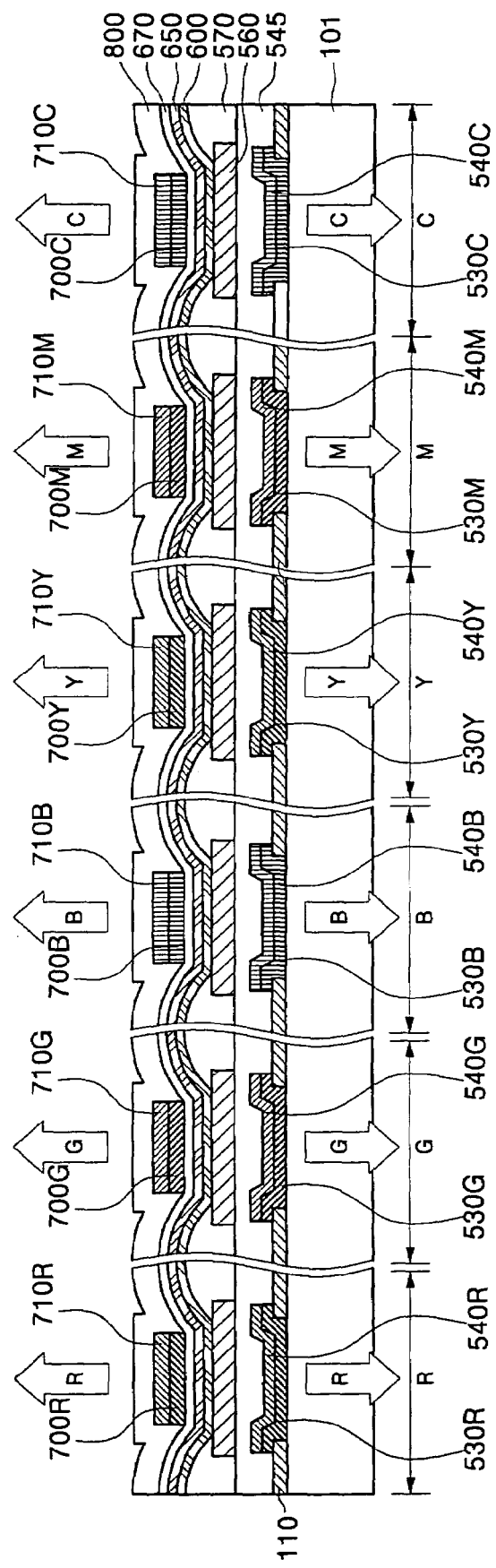
FIG. 7 is a cross-sectional view of a passive matrix dual emission OLED according to a fifth embodiment of the present invention.

Turning now to FIG. 7, FIG. 7 is a cross-sectional view illustrating an organic light emitting display and a fabrication method thereof according to a fifth embodiment of the present invention. The organic light emitting display of FIG. 7 is a dual emission passive matrix type OLED having color modulation layer. Dual emission is both bottom emission and top emission.

Referring to FIG. 7, a substrate 101 having red, green, blue, yellow, magenta, and cyan pixel areas (R, G, B, Y, M, and C) is prepared. A black matrix pattern 110 exposing parts of the respective R, G, B, Y, M, and C pixel areas can be formed on the substrate 101.

First color modulation layers separated from each other in a unit of pixel areas R, G, B, Y, M, and C are formed on the exposed areas. The first color modulation layers can be a mono-layered structure of a first color filter layers 530R, 530G, 530B, 530Y, 530M, and 530C, or be a stacked structure having the first color filter layers and a first color conversion layers 540R, 540G, 540B, 540Y, 540M, and 540C stacked on the first color filter layers. It is preferable that an over-coating layer 545 is formed on the substrate on which the first color modulation layers are formed. First electrodes 560 corresponding to the respective first color modulation layers are formed on the over-coating layer 545. A pixel defining layer 570 and an organic functional layer 600 having at least an emission layer are formed on the substrate 101 on which the first electrodes 560 are formed. Since the substrate 101, the black matrix pattern 110, the first color modulation layers, the over-coating layer 545, the first electrodes 560, the pixel defining layer 570, and the organic functional layer 600 have already been described in conjunction with FIG. 5, descriptions thereof will be omitted.

Subsequently, a second electrode 650 substantially equal to that in FIG. 3, a transparent passivation layer 670, second color modulation layers, and an over-coating layer 800 are formed on the organic functional layer 600. The second color modulation layers can have a mono-layered structure of 710R, 710G, 710B, 710Y, 710M, and 710C color filter layers, or a stacked structure in which a second color conversion layers 700R, 700G, 700B, 700Y, 700M, and 700C and the second color filter layers are sequentially stacked.

In the embodiment of FIG. 7, the light emitted from the emission layer is radiated toward the substrate 101 through the transparent first electrodes 560 and through the first color modulation layers, wherein the first color modulation layers are located on the opposite side of the first electrodes 560 from the emission layer. And also the light emitted from the emission layer is radiated through the transparent second electrode 650 and through the second color modulation layers, wherein the second color modulation layers are located on an opposite side of the second electrode 650 than the emission layer. As a result, it is possible to realize high purity red, green, blue, yellow, magenta, and cyan colors, resulting in a dual-emission organic light emitting display having enhanced color reproducibility.

Figure 8:
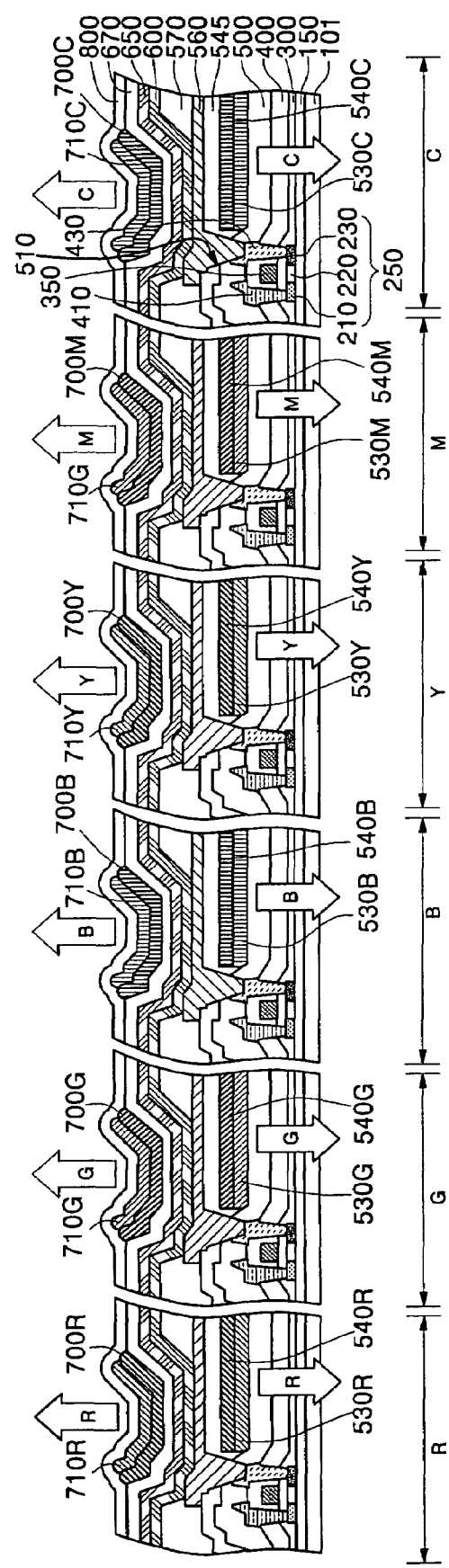
FIG. 8 is a cross-sectional view of a active matrix dual emission OLED according to a sixth embodiment of the present invention.

Turning now to FIG. 8, FIG. 8 is a cross-sectional view illustrating an organic light emitting display and a fabrication method thereof according to a sixth embodiment of the present invention. The organic light emitting display of FIG. 8 is a dual-emission active matrix type OLED having color modulation layers.

Referring to FIG. 8, a substrate 101 having red, green, blue, yellow, magenta, and cyan pixel areas R, G, B, Y, M, and C is prepared. The substrate 101 is a transparent substrate and can be made of glass, plastic, or quartz. A buffer layer 150, an active layer 250 having a source region 210, a drain region 230, and a channel region 220, a gate insulating layer 300, a gate electrode 350, a first insulating interlayer 400, a source electrode 410, a drain electrode 430, a second insulating interlayer 500, first color modulation layers, an over-coating layer 545, first electrodes 560, a pixel defining layer 570, and an organic functional layer 600 having at least an emission layer are formed on the substrate 101, and are substantially the same as those already described in conjunction with FIG. 6, respectively. The first color modulation layers can be a mono-layered structure of a first color filter layer 530R, 530G, 530B, 530Y, 530M, and 530C, or can be a stacked structure having first color filter layers and first color conversion layers 540R, 540G, 540B, 540Y, 540M, and 540C stacked on the first color filter layers.

Subsequently, the second electrode 650, a transparent passivation layer 670, the second color modulation layers, and an over-coating layer 800 are formed, wherein these layers are substantially the same as those already described in conjunction with FIG. 6, respectively. The second color modulation layers can have a mono-layered structure of second color filter layers 710R, 710G, 710B, 710Y, 710M, and 710C, or can have a stacked structure in which a second color conversion layers 700R, 700G, 700B, 700Y, 700M, and 700C and the second color filter layers are sequentially stacked.

Figure 9:
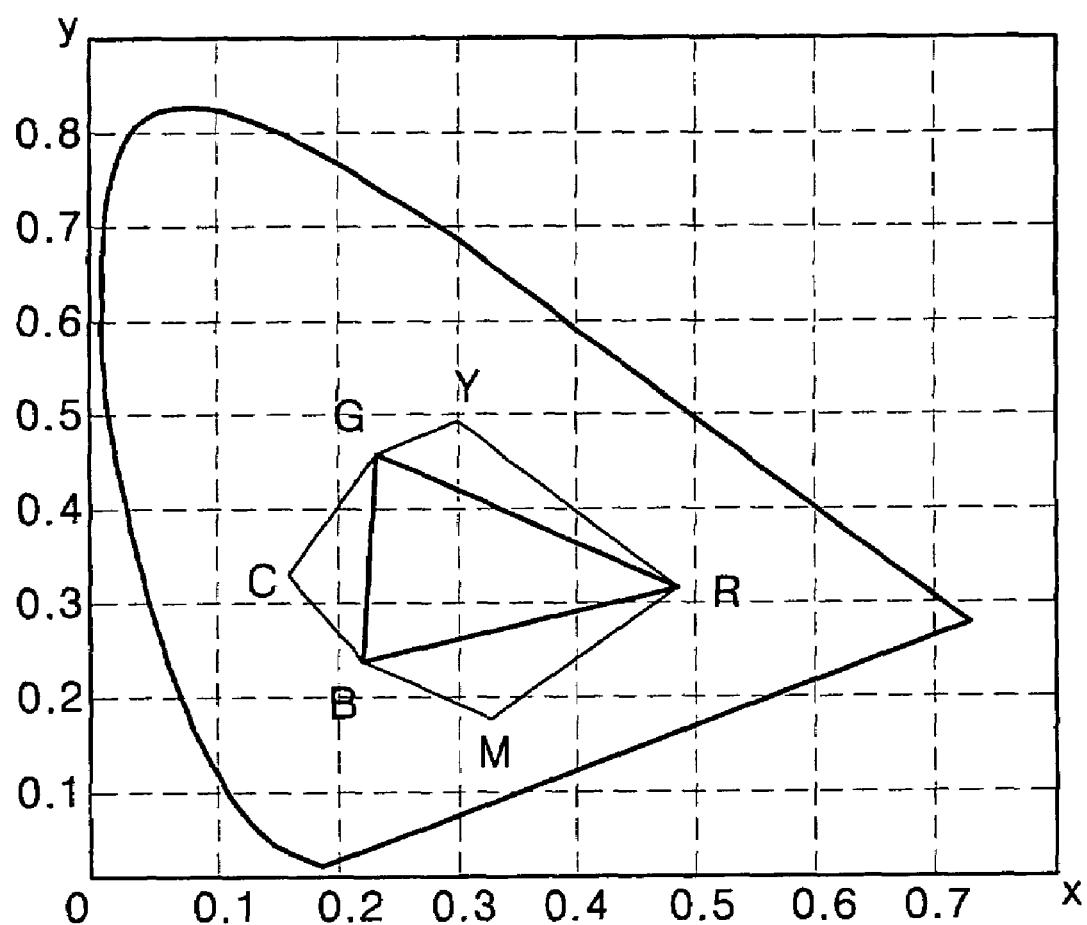
FIG. 9 is a graph showing color reproducibility of an organic light emitting layer according to an embodiment of the present invention.

Turning now to FIG. 9, FIG. 9 is a graph illustrating color reproducibility of the organic light emitting displays according to an embodiment of the present invention. Referring to FIG. 9, transmitted light beams are generated by allowing white light emitted from the emission layer to pass through the red, green, blue, yellow, magenta, and cyan color modulation layers and the colors R, G, B, Y, M, and C of the transmitted light beams are converted into color coordinates as illustrated in FIG. 9. When the color coordinates corresponding to the R, G, B, Y, M, and C colors are all linked, the result is the area on the graph illustrated in FIG. 9. In FIG. 9, the area of R, G, B, Y, M and C all linked is greater than when just the color coordinates corresponding to red R, green G, and blue B are all linked. Therefore, the organic light emitting displays according to the present invention can independently realize yellow Y, magenta M, and cyan C, in addition to red R, green G, and blue B, so that it is possible to realize natural colors having a wider range. In other words, the organic light emitting displays according to the present invention have excellent color reproducibility.

As described above, according to the present invention, it is possible to maintain white balance after an OLED ages and is used a lot by forming an emission layer to emit white. In addition, it is possible to realize yellow, magenta, and cyan colors as well as red, green, and blue colors by using different color modulation layers, thus enhancing color reproducibility. Furthermore, by forming the color modulation layers using the LITI method, it is possible to reduce the fabrication time while realizing high resolution.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display (OLED), comprising:
a substrate;
a first electrode arranged on the substrate;
a second electrode arranged on the first electrode;
an organic functional layer arranged between the first electrode and the second electrode, the organic functional layer comprises at least an emission layer; and
red, green, blue, cyan, magenta, and yellow color modulation layers separated from each other and arranged on the second electrode, wherein one of the first electrode and the second electrode is transparent.

2. The OLED of claim 1, wherein each color modulation layer is produced by a thermal transfer imaging process.

3. The OLED of claim 1, wherein each color modulation layer is a color filter layer.

4. The OLED of claim 1, wherein each color modulation layer comprises a stacked structure comprising a color filter layer and a color conversion layer.

5. The OLED of claim 1, wherein the emission layer is a white light-emitting layer.

6. The OLED of claim 5, wherein the emission layer comprises a plurality of sub emission layers.

7. The OLED of claim 6, wherein one of said plurality of sub emission layers emits orange-red light, and another one of said plurality of sub emission layers emits blue light.

8. The OLED of claim 7, wherein the sub emission layer that emits orange-red light being phosphorescent and the sub emission layer that emits blue light being fluorescent.

9. The OLED of claim 1, wherein the organic functional layer further includes at least one of a charge injection layer and a charge transport layer.

10. The OLED of claim 1, further comprising a thin film transistor arranged between the substrate and the first electrode, the thin film transistor being electrically connected to the first electrode.

11. The OLED of claim 1, wherein the first electrode is transparent, the second electrode is reflective.

12. The OLED of claim 11, further comprising an overcoating layer arranged between the color modulation layers and the first electrode.

13. The OLED of claim 11, the substrate comprising a light-shielding area and a light-transmitting area, the OLED further comprising:
an active layer arranged within the light-shielding area, the active layer comprising a source region, a drain region, and a channel region;
a gate insulating layer arranged on the active layer;
a gate electrode arranged on the gate insulating layer and overlapping the channel region;
a first insulating interlayer arranged within both the light-shielding area and within the light transmitting area, the first insulating interlayer covering the gate electrode;
a source electrode and a drain electrode arranged to extend through the first insulating interlayer and to contact the source region and the drain region, respectively; and
a second insulating interlayer arranged within the light-shielding area including being arranged on source electrode and on the drain electrode, the second insulating interlayer also being arranged within the light-transmitting area, the second insulating interlayer having a via hole adapted to expose one of the source electrode and the drain electrode, wherein the first electrode is arranged on the second insulating interlayer and within the light-transmitting area and is connected to one of the source electrode and the drain electrode via the via hole, and wherein the color modulation layers are arranged between the substrate and the first electrode and within the light-transmitting area.

14. The OLED of claim 1, wherein the second electrode is a transparent electrode, the first electrode is a reflective electrode and the color modulation layers are arranged on the second electrode.

15. The OLED of claim 14, further comprising a transparent passivation layer arranged between the color modulation layers and the second electrode.

16. The OLED of claim 15, wherein the transparent passivation layer is a layer selected from the group consisting of an inorganic layer, an organic layer, and an inorganic-organic compound layer.

17. The OLED of claim 14, further comprising an overcoating layer arranged on the color modulation layers.

18. The OLED of claim 1, wherein the first electrode and the second electrode are both transparent, the color modulation layers each comprise first color modulation layers arranged between the substrate and the first electrode and second color modulation layers arranged on the second electrode.

19. The OLED of claim 18, further comprising an over-coating layer arranged between the each first color modulation layer and the first electrode.

20. The OLED of claim 18, further comprising a transparent passivation layer arranged between the second electrode and each second color modulation layer.

21. The OLED of claim 18, further comprising an over-coating layer arranged on each second color modulation layer.

22. The OLED of claim 18, the substrate comprising a light-shielding area and a light-transmitting area, the OLED further comprising:
- an active layer arranged within the light-shielding area, the active layer comprising a source region, a drain region, and a channel region;
- a gate insulating layer arranged on the active layer;
- a gate electrode arranged on the gate insulating layer and overlapping the channel region;
- a first insulating interlayer arranged within both the light-shielding area and within the light transmitting area, the first insulating interlayer covering the gate electrode;
- a source electrode and a drain electrode arranged to extend through the first insulating interlayer and to contact the source region and the drain region, respectively; and
- a second insulating interlayer arranged within the light-shielding area including being arranged on source electrode and on the drain electrode, the second insulating interlayer also being arranged within the light-transmitting area, the second insulating interlayer having a via hole adapted to expose one of the source electrode and the drain electrode, wherein the first electrode is arranged on the second insulating interlayer and within the light-transmitting area and is connected to one of the source electrode and the drain electrode via the via hole, and wherein each color modulation layer is arranged between the substrate and the first electrode and within the light-transmitting area.

23. The OLED of claim 22, wherein the first color modulation layers are arranged between the second insulating interlayer and the first electrode, the OLED further comprises an over-coating layer arranged between the first color modulation layers and the first electrode.

24. The OLED of claim 1, wherein each of said color modulation layers comprises a color conversion layer.

25. The OLED of claim 24, each of said color conversion layers comprise a fluorescent material.

26. The OLED of claim 25, the fluorescent material within each of said color conversion layers being adapted to convert white light emitted from the emission layer to light of only a color selected from the group consisting of red, green, blue, cyan, magenta and yellow.

* * * * *